United States Patent
Rosenfeld (10) Patent No.: US 6,370,416 B1
(45) Date of Patent: Apr. 9, 2002

(54) FMRI SIGNAL PROCESSING (75) Inventor: Daniel Rosenfeld, Haifa (IL)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

(21) Appl. No.: 09/199,326

(22) Filed: Nov. 25, 1998

(51) Int. Cl.$^7$ ................................................ A61B 5/055
(52) U.S. Cl. ...................... 600/410; 128/922; 382/128
(58) Field of Search ................................ 600/410, 407, 600/544; 324/309; 382/128, 254, 275; 128/920, 922

(56) References Cited

U.S. PATENT DOCUMENTS

| | | | | |
|---|---|---|---|---|
| 5,010,504 A | * | 4/1991 | Lee et al. ................... | 364/574 |
| 5,490,516 A | * | 2/1996 | Hutson ........................ | 128/696 |
| 5,887,074 A | * | 3/1999 | Lai et al. .................... | 382/128 |
| 6,009,208 A | * | 12/1999 | Mitra et al. ................. | 382/254 |
| 6,064,903 A | * | 5/2000 | Riechers et al. ............ | 600/407 |
| 6,073,041 A | * | 6/2000 | Hu et al. ..................... | 600/410 |
| 6,157,677 A | * | 12/2000 | Martens et al. ......... | 375/240.16 |
| 6,181,832 B1 | * | 1/2001 | Maas, III .................... | 382/294 |

OTHER PUBLICATIONS

"Time Course EPI of Human Brain Function During Task Activation," by Peter A. Bandettini et al., Magnetic Resonance in Medicine, vol. 25, pp. 390–397 (1992).

"Processing Strategies for Time–Course Data Sets in Functional MRI of the Human Brain," by Peter A. Bandettini et al., Magnetic Resonance in Medicine, vol.30, pp. 161–173 (1993).

"Real–Time Functional Magnetic Resonance Imaging," by Robert W. Cox et al., Magnetic Resonance in Medicine, vol. 33, pp. 230–236 (1995).

"Numerical Recipes in C, the Art of Scientific Computing," by William H. Press et al., Second Edition, Cambridge University Press, pp 59–70 and pp. 456–495 (1992).

* cited by examiner

Primary Examiner—Marvin M. Lateef
Assistant Examiner—Shawna J. Shaw
(74) Attorney, Agent, or Firm—Hoffman, Wasson & Gitler, PC; Sanford T. Colb (57) ABSTRACT

A method for MRI signal analysis of an area of a biological tissue comprising:
  a) providing a biological tissue, wherein physiological activity is taking place in an area thereof;
  b) acquiring sequential magnetic resonance images, at least during a portion of time in which said physiological activity is taking place, of said area and of at least a portion of the tissue in a vicinity of the area;
  c) constructing, responsive to at least one pixel-related parameter value of said images, a pixel parameter space; and
  d) separating the pixel parameter space into at least two subspaces.

25 Claims, 5 Drawing Sheets

FIG.4

FMRI SIGNAL PROCESSING

FIELD OF THE INVENTION

The invention relates in general to functional MR imaging, and in particular to fMRI signal analysis.

BACKGROUND OF THE INVENTION

Changes in neuronal activity responsive to the accomplishment of mental and/or physical tasks, such as touching a finger to thumb, are accompanied by physiological changes in regions of the brain associated with and/or controlling the activity. Physiological changes such as cerebral blood flow, blood volume, blood oxygenation and/or metabolism, occurring in such a region of the brain are made visible by functional MR imaging (fMRI).

A typical fMRI session comprises the following steps: (a) stimulating a subject (e.g. by asking him to perform, preferably, a periodic task, usually a task targeting a particular brain region, or be subjected to a periodic visual/audio/tactile stimuli), (b) MR imaging a region of the brain supposed to be involved in the accomplishment of that task, and (c) analyzing a time series of acquired images to determine physiological changes in the brain region.

Often, the signal to noise ratio of fMRI images is poor, so a synchronized detection method of image analysis is preferably used. It is expected that the physiological changes mirror the activity that the subject performs. Thus, the images are analyzed based on expected correlation between variations in pixel values in the analyzed regions and the activity performed by the subject. Generally, however, there is a delay between the performance of the activity and a change in the physiological variable. This delay, as well as the exact response of the pixel value to the activity, are generally not known in advance.

Figure 1:
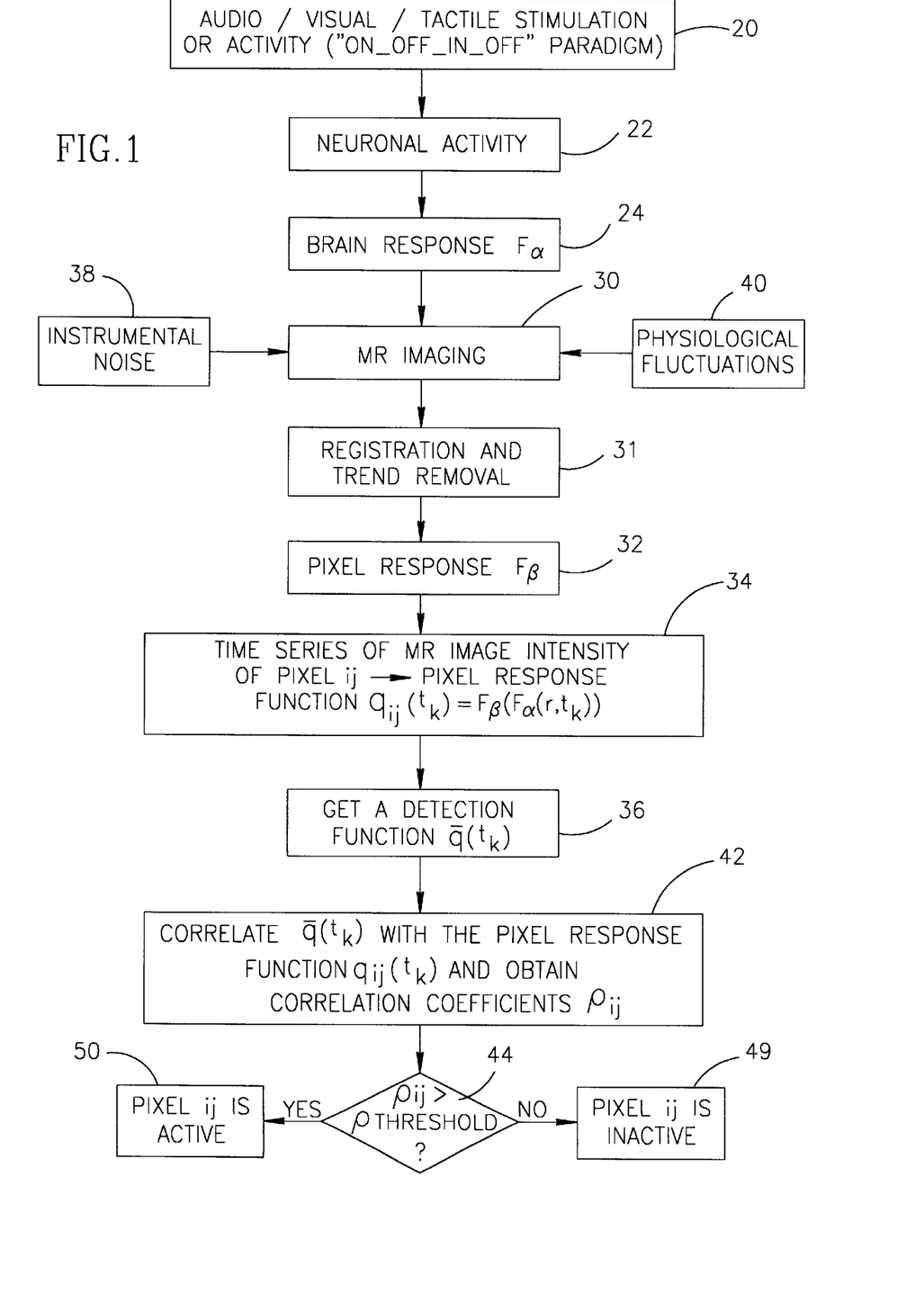
FIG. 1 shows a flow chart for a general fMRI data analysis.

Reference is now made to FIG. 1 which shows a flow chart for a general fMRI data analysis. Due to the repetitive nature of the activity performed by the subject and the dependence of the physiological changes on the activity, many aspects of the process are best described as a time varying periodic function. An "on-off-on-off-on" stimulation (or activity) paradigm 20, such as touching a finger to thumb, may be represented by an activation function, where on's are 1s and off's are 0s. Activity 20 induces neuronal activity 22. As a result of neuronal activity 22, certain brain tissues react (24), for example blood vessels open to bring in oxygenated blood and/or neurons use up oxygen in a blood stream. These effects are represented by $F_\alpha(r, t_k)$ (24), where $F_\alpha(r, t_k)$ is the possibly non-linear response of the brain, as a function of location and time, to the activity. $F_\beta$ is the possibly non-linear response of a pixel, in the image, to the response of the brain $F_\alpha(r, t_k)$ as imaged by the MR imager (30). $q_{ij}(t_k)=F_\beta(F_\alpha(r, t_k))$ (34), is a pixel, (pixel ij); response function which relates variations in (ij)th pixel intensity, as imaged by the MR imager in step 30, and/or other image parameters, such as pixel phase, to physiological changes 24. In the above described brain and pixel responses, $t_k$ represents the discretization of time, which corresponds to the instant at which each MR image is acquired. Typically, $t_k=k*\Delta t$, where $\Delta t$ is the time difference between consecutive images. Alternatively, the images may be non equally spaced in time. Subscript ij represents the discretization of locality r. Typically, image registration (alignment) is performed so that a same image pixel corresponds to a same brain volume over an entire series of images. Typically, the pixel response function is difficult to detect and/or otherwise analyze because of the above mentioned low signal-to-noise ratio. A small signal and two different noise sources, instrumental noise 38, and physiological fluctuations 40, contribute to this low signal-to-noise ratio.

In a typical fMRI study, the activity of a brain tissue may be assessed by comparing the pixel response function $q_{ij}(t_k)$ 34, and the activation function. As it is difficult to detect directly pixel activity from the collected data because of the very low signal-to-noise ratio, the detection is performed synchronously by correlation, 42, between the pixel response $q_{ij}(t_k)$, embedded in noise and a certain detection (or reference) function, 36, which is thought to best fit the detection task. The synchronously detected pixel response function, $q_{ij}(t_k)$, is then compared with the activation function.

According to the correlation results 44, which are reflected by the correlation coefficient(s) $\rho_{ij}$, the analyzed pixel is said to have no activity 49, if the correlation is poor, or to be active 50, if the correlation is high. Intermediary correlation values may point to different levels of activity of the analyzed biological tissues contained in a voxel.

In conventional fMRI, the detection (or reference) function, 36, which is thought to best fit the detection task is guessed at. The most commonly guessed detection functions are square pulses, which in fact are identical to the repetitive part of the activation function describing an "on-off-on-off" task, a sinusoidal pulse or an exponential pulse which are close to the square pulse. The drawback of this method is that there is no physiological or other objective basis for guessing a detection function, that a guessed detection function may be delayed relative to the activation function and that the activation function is usually not a square function.

"Time Course EPI of Human Brain Function during Task Activation" by Peter A. Bandettini et al., Magnetic Resonance in Medicine, Vol. 25, p. 390–397 (1992); "Processing Strategies for Time-Course Data sets in Functional MRI of the Human Brain", by Peter A. Bandettini et al., Magnetic Resonance in Medicine, Vol. 30, p. 161–173 (1993) and "Real-Time Functional Magnetic Resonance Imaging", by Robert W. Cox et al., Magnetic Resonance in Medicine, Vol. 33, p. 230–236 (1995) all of which are incorporated herein by reference, deal with fMRI signal processing using a guessed detection function.

In "Processing Strategies for Time-Course Data sets in Functional MRI of the Human Brain", Bandettini et al. use a time-course function in a given pixel as detection (reference) function in fMRI signal analysis. This detection (reference) function may be an experimental time-course function of some particular pixel or a time-course function which is linearly filtered from several experimental time-course functions. This detection (reference) function is then correlated with time-course functions in other pixels. Linear filtering such as performed by Peter, A. Bandettini may eliminate local differences. But as Bandettini's detection function is an experimental time-course function f in some particular pixel or an average of several experimental f's, the linear filtering, as applied by Bandettini, does not ensure the obtaintion of a detection function which is most appropriate in the synchronous detection of a pixel response $q_{ij}(t_k)$, embedded in noise.

In the claims and specification of the present application each of the verbs, "comprise" and "include" and conjugates thereof are used to convey that the object or objects of the verb are not necessarily a listing of all the components, elements or parts of the subject or subjects of the verb.

SUMMARY OF THE INVENTION

One aspect of some preferred embodiments of the present invention relates to calculating a detection function for use in synchronous detection in fMRI signal analysis. Preferably, the detection function for fMRI data analysis is derived from the fMRI data itself. Some preferred embodiments of the present invention relate to a method of determining a detection function by non-linear filtering, preferably, from response functions of a plurality of pixels situated in a region of interest whose behavior is studied. More preferably, the non-linear filtering method uses eigen analysis in order to separate at least two subspaces, namely signal subspace (one or more) and noise subspace, within the space of all the fMRI time course signals. Preferably, the final result of the method is the obtaintion of basis vectors that span these signal and noise subspaces. Preferably, the basis vectors of the signal subspace(s) are used as the detection function. More generally, other non-linear filtering methods, such as median filtering, may also be used to calculate a detection function.

One way of separating the signal and noise subspaces is the well known Gram-Schmidt orthogonalization, which may, in some cases be numerically problematic. Therefore, in some preferred embodiments of the present invention the singular value decomposition method is used in order to separate the signal and noise subspaces.

In SVD calculations, an M×N matrix [A], whose elements are the intensity values of the pixels of MR images, is constructed from pixel response functions $q_{ij}(t_k)$ related to a region of the brain. In matrix [A], M=number of pixels and N=number of images. In SVD calculations, matrix [A] is decomposed into a product of three matrices, namely [U], [V] and [W]. In a preferred embodiment of the present invention, a calculated detection (reference) function $\bar{q}(t_k)$ 36, is obtained from the SVD calculations. As this calculated (reference) detection function $\bar{q}(t_k)$, is directly generated from the studied area, it better represents the response $q_{ij}(t_k)$, of a studied pixel in a more competent way than does a guessed function. In SVD calculations, the calculated detection function is given by the column of matrix [U] which has the same index as the column of matrix [W] which contains the $\omega_j$ element having the greatest magnitude. The matrix [W] may have more than one $\omega_j$ element with substantially greater magnitude compared to the other $\omega_j$ elements. As a consequence, the calculated detection (reference) function $\bar{q}(t_k)$ may also be defined by more than one column of matrix [U] with the same indexes as the columns of [W] with the largest ($\omega_j$ elements.

Another aspect of some preferred embodiments of the present invention relates to the detection of two, or more, overlapping pixel responses functions; for example, in case a subject is subjected to periodic electric stimuli on a finger which is performing a voluntary activation task.

There is therefore provided, in accordance with a preferred embodiment of the present invention, a method for MRI signal analysis of an area of a biological tissue comprising:

a) providing a biological tissue, wherein physiological activity is taking place in an area thereof;

b) acquiring sequential magnetic resonance images, at least during a portion of time in which said physiological activity is taking place, of said area and of at least a portion of the tissue in a vicinity of the area;

c) constructing, responsive to at least one pixel-related parameter value of said images, a pixel parameter space; and d) separating the pixel parameter space into at least two subspaces.

There is also provided, in accordance with a preferred embodiment of the present invention, a method for functional MRI (fMRI) signal analysis of an area of the brain comprising:

a) invoking neuronal activity in an area of the brain of a subject;

b) acquiring sequential magnetic resonance images, at least during a portion of time in which said area of the brain of a subject is activated, of said area and of at least a portion of the brain in a vicinity of the area;

c) constructing, responsive to at least one pixel-related parameter value of said images, a pixel parameter space; and d) applying non linear filtering to said pixel parameter space, wherein said non linear filtering separates said pixel parameter space into at least two subspaces.

Preferably, said at least one pixel-related parameter comprises a pixel magnitude value. Preferably, said at least two subspaces comprise a signal subspace and a noise subspace. Preferably, said non linear filtering uses singular value decomposition. Preferably, said magnitude values are arranged in a matrix.

There is also provided, in accordance with a preferred embodiment of the present invention, a method comprising decomposing the matrix of magnitude values into a product of a plurality of matrices, the columns of one matrix of the plurality of matrices comprising a plurality of basis vectors which span said at least two subspaces. Preferably, said at least two subspaces comprise a signal subspace and a noise subspace. More preferably, one basis vector spans said signal subspace. In some preferred embodiments of the present invention, two or more basis vectors span said signal subspace.

There is also provided, in accordance with a preferred embodiment of the present invention, a method comprising detecting temporal variations in said area over a sequence of images using a synchronous detection fiction. Preferably, said basis vector is used as a detection function. In some preferred embodiments of the present invention, said detection comprises synchronous detection. Preferably said basis vectors are used as synchronous detection functions.

There is also provided, in accordance with a preferred embodiment of the present invention, a method comprising:

a) repeating said synchronous detection on all the pixels related to an area of interest in the brain;

b) obtaining, for each said synchronous detection, at least one detection indicator which indicates a quality of said synchronous detection; and c) identifying those of said at least one detection indicator which meet at least one certain criterion.

Preferably, said method also comprises:

a) deriving a plurality of detection functions from image portions of a region of the brain in the vicinity of the area in said sequential images;

b) synchronously detecting temporal variations in said area, over a sequence of images, using synchronous detection:

c) obtaining a plurality of detection indicator values from said synchronous detection, for a plurality of pixels related to an area of interest in the brain;

d) constructing a vector from detection indicator values associated with a single pixel, for each pixel of said plurality of pixels;

e) calculating the magnitude of each of said vectors; and f) identifying those of said magnitudes which meet at least one certain criterion.

g) deriving a vector phase from each of said vectors.

Preferably, a delay between the neuronal activity and a cause which invoked it using said phase of each vector is detected from said vector phase. Additionally, at least a relative intensity and/or an absolute intensity of said neuronal activity is determined from said magnitude of each vector. Preferably, said neuronal activity in said area of the brain of a subject is periodic. In some preferred embodiments of the present invention at least one of said MR images is acquired after a cession of said invoking of neuronal activity. Preferably, trends unrelated to said neuronal activity are removed before said applying non linear filtering.

In some other preferred embodiments of the present invention, at least a second activity simultaneous with the first activity is also invoked. Preferably, signals related to said at least two invoked activities are independently extracting.

There is also provided, in accordance with a preferred embodiment of the present invention, a method for functional MRI (fMRI) signal analysis of an area of the brain comprising:

a) invoking neuronal activity in an area of the brain of a subject;

b) acquiring sequential magnetic resonance images, at least during a portion of time in which said area of the brain of a subject is activated, of said area and of at least a portion of the brain in a vicinity of the area;

c) registering said sequential images;

d) constructing a pixel parameter space, responsive to pixel magnitude values in said images;

e) removing, from said space, at least one trend unrelated to said neuronal activity;

f) arranging said trend-removed magnitude values in a matrix;

g) separating said pixel parameter space into at least two subspaces, using singular value decomposition, such that said matrix is decomposed into a product of a plurality of matrices, the columns of one matrix of the plurality of matrices comprising a plurality of basis vectors which span said at least two subspaces;

h) identifying said at least two subspaces as a signal subspace and as a noise subspace;

i) selecting at least one of said basis vectors which spans said signal subspace;

j) detecting variations in said area of the brain over a sequence of images using said at least one vector as a synchronous detection function, for all the pixels related to an area of interest in the brain;

k) obtaining, for each said synchronous detection, at least one detection indicator which indicates a quality of said synchronous detection.

Preferably, said at least one basis vector which spans said signal subspace comprises at least two independent basis vectors.

In some preferred embodiments of the present invention, a plurality of detection indicators are obtained for said each pixel, then a vector is constructed from said detection indicators and finally, the magnitude of each said constructed vector is calculated.

BRIEF DESCRIPTION OF FIGURES

The invention will be more clearly understood by reference to the following description of preferred embodiments thereof read in conjunction with the accompanying figures. Identical structures, elements or parts that appear in more than one of the figures are labeled with the same numeral in all the figures in which they appear.

DETAILED DESCRIPTION OF PREFERRED EMBODIMENTS

The present invention, in some embodiments thereof, intends to replace the guessing of a detection function or the use of an actual response of a pixel, in synchronous detection, by a calculation of the same function. In some preferred embodiments of the present invention, this calculation is preferably performed by singular value decomposition or other non-linear filtering methods (e.g. median filtering). More preferably, a space comprising a response function to be detected, is separated into at least two subspaces namely signal subspace(s) and noise subspace. Most preferably, the calculation is conducted from MRI data collected from an entire region, or a sub region, of the brain. Thus, fMRI data analysis performed in accordance with preferred embodiments of the present invention, relates both to a single sub-region imaged by a single pixel and to the immediate vicinity of that sub-region.

A region of a subject's brain is, preferably, selected on the basis of assumptions and/or of prior knowledge on its relation with some specific tasks and/or stimuli. A plurality of MR images of a region of a subject's brain are preferably sequentially acquired during a subject's activation by performing an activation task, for example, touch-a-finger-to-thumb (steps 20–34 in FIG. 1). Alternatively or additionally, the subject may be subjected to a pulsed (periodic) audio or visual or tactile stimulus. Alternatively, the subject may be subjected to a pulsed (periodic) audio, visual or tactile stimulation simultaneously to his performing the activation task. Each image provides an intensity value at each pixel. Preferably, the MR images continue to be acquired sequentially after the activation task and/or the stimulus is stopped. Care is taken to maintain image registration (alignment) so that all the intensity values of a pixel in a series of images pertain to the same location. A response vector is constructed from a time series of intensity values of a single pixel of the sequential MR images. Each intensity value of a single series represents a coordinate of a vector in an N dimension space, where N is the number of images. Thus, all the intensity values of a pixel from a series of images define a response vector in this space. From a plurality of such response vectors, each one corresponding to one of the selected pixels, a filtered response vector is obtained by one of the methods described above.

Figure 2:
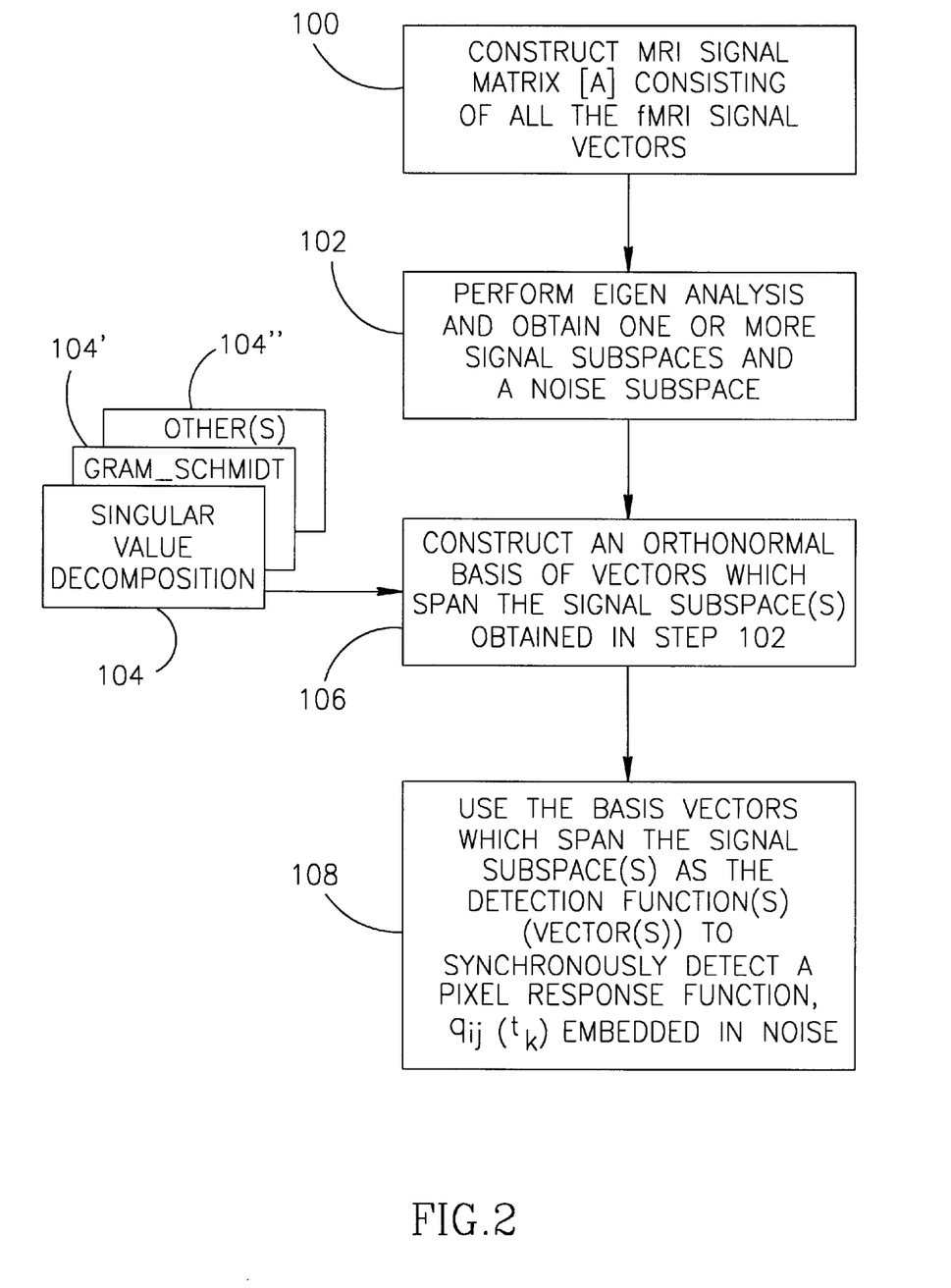
FIG. 2 is a flow chart of fMRI signal analysis in accordance with a preferred embodiment of the present invention.

The logic, of some preferred embodiments hereof, as schematically shown in FIG. 2, consists in separating the total fMRI signals, 100, (relative to an area of interest or all the imaged pixels), space into at least two subspaces, namely "signal" and "noise" subspaces, by using eigenanalysis, 102. An orthonormal basis of vectors which span the "signal" subspace is then constructed, 106, by a non-linear filtering method, for example singular value decomposition, 104, Gram-Schmidt, 104', and other(s), 104''. The basis vector(s) thus obtained is (are) used as detection function(s) to synchronously detect the pixel response function(s) from the total raw fMRI signals, 108.

Applying filtering methods, necessitates a great number of images to be acquired. An exemplary number of images acquired in fMRI signal processing is 128. Typically, the imaging time will increases with increasing number of images. This allows other physiological processes (e.g. subject's movement, pulsatile brain motion, pulsatile blood flow, etc.) to contribute to artifactual signal changes unrelated to induced neuronal activity. If not removed, these artifacts may appear as trends which contaminate the images. Trends unrelated to induced neuronal activity are treated as noise. Removing any trend, before the SVD method is applied, will preferably increase significantly the quality of the final result.

Figure 3A:
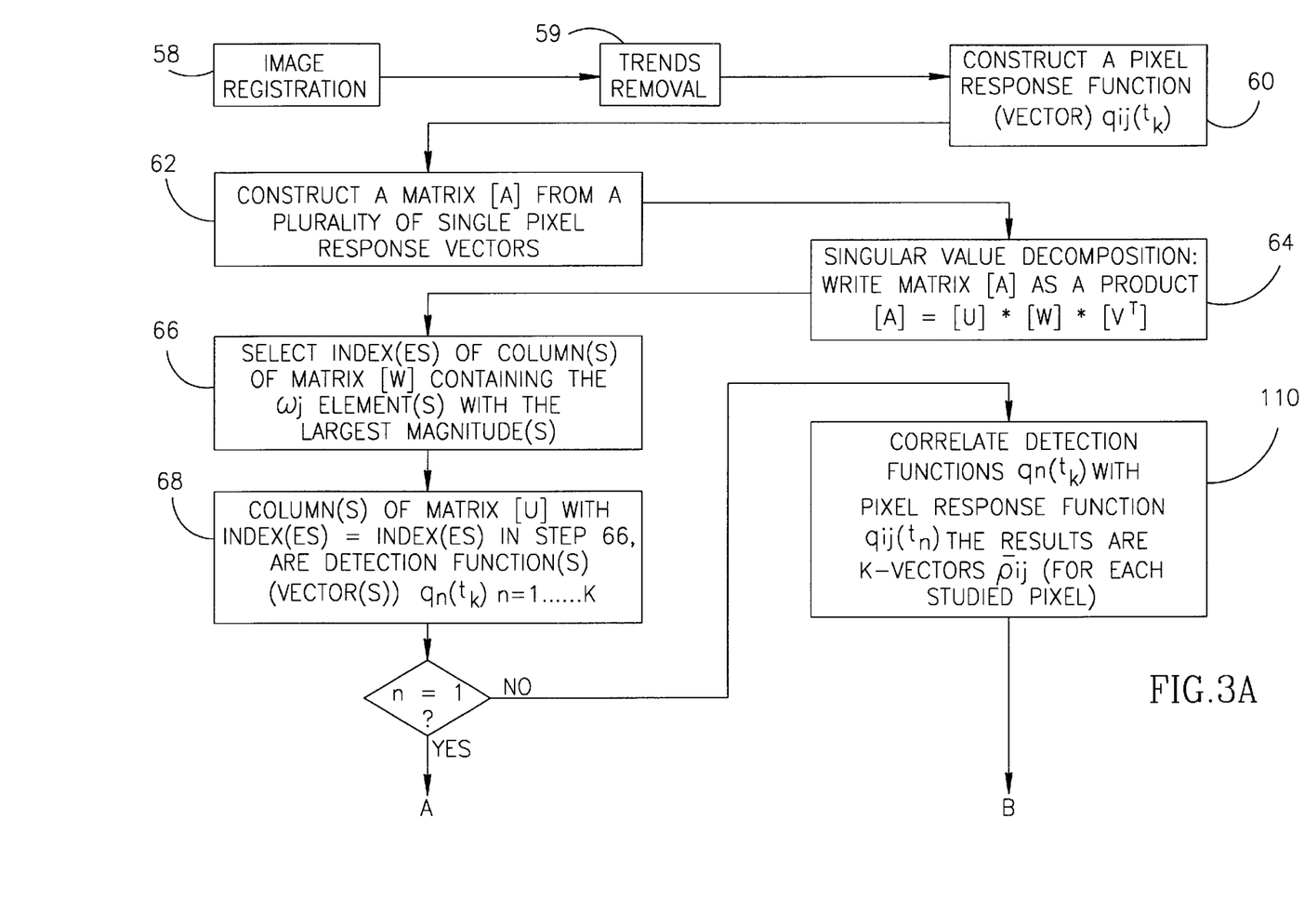
FIG. 3A and FIG. 3B show a flow chart for fMRI data analysis in accordance with a preferred embodiment of the present invention.
Figure 3B:
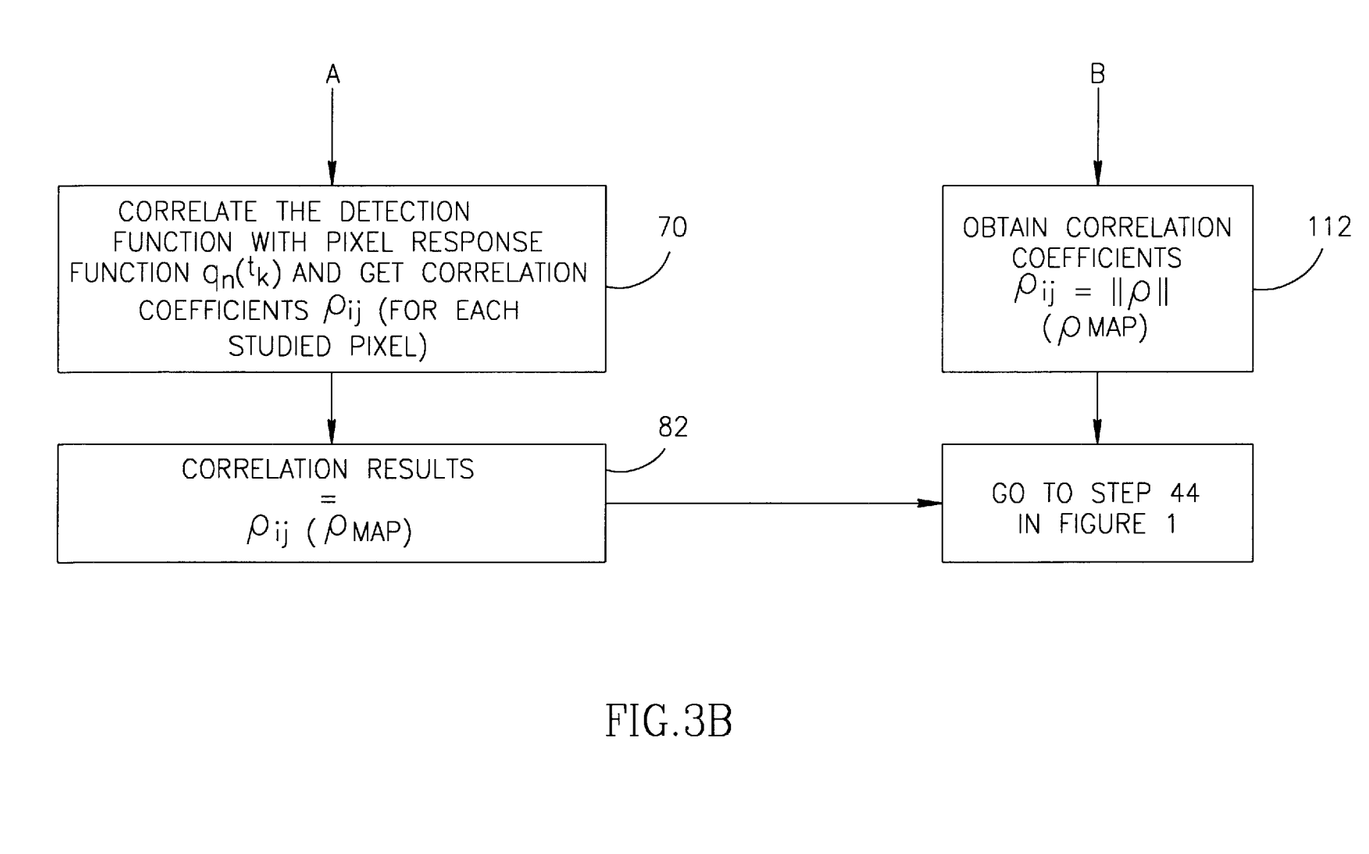

Reference is now made to FIG. 3 which shows a flow chart for fMRI data analysis in accordance with a preferred embodiment of the present invention. Image registration (alignment) is performed in step 58. In step 59 trends unrelated to induced neuronal activity (e.g. subject's movement, pulsatile brain motion, pulsatile blood flow, etc.) are removed, In step 60, a pixel response vector is constructed from a time series of the intensity values in the MR images corresponding to a single pixel. In step 62, an M×N matrix [A], where M=number of pixels, and N=number of images, is constructed from a plurality of such pixel response vectors, each vector related to one of the pixels identified in the MR images.

In the SVD calculations, matrix [A] is decomposed into the product of three matrices, namely an M×N orthogonal matrix [U], an N×N diagonal matrix [W] with positive or zero elements, called the singular values, and the transpose of an N×N orthogonal matrix [V] (FIG. 3, step 64). It is assumed that the elements of the diagonal [W] matrix are arranged in decreasing order of their magnitude. If not, the [W] matrix may be manipulated so that the diagonal elements are arranged in decreasing order of their magnitude. When diagonal matrix [W] is manipulated so that the diagonal elements be arranged in decreasing order of their magnitude, matrices [U] and [V] are preferably rearranged accordingly.

The required detection function (vector) is the column of matrix [U] which has the same index J as the column of matrix [W] containing the $\omega_j$ element with the highest magnitude (step 66). Because the diagonal elements of matrix [W] are arranged in decreasing order, the $\omega_j$ element with the highest magnitude will be contained in the column with the lowest J (i.e. the fist column with j=1).

In SVD calculations, $\omega_j$ elements with the largest magnitudes are thus contained in the first few columns of matrix [W]. Then, the magnitude of the $\omega_j$ elements often drops abruptly. The columns of matrix [U] associated with the $\omega_j$ elements with the highest magnitudes are related to the calculated detection function $\bar{q}_n(t_k)$, where n=1, 2, 3, ... K (step 68 in FIG. 3), while the columns of matrix [U] associated with $\omega_j$ elements with the lowest magnitudes are associated with noise. This defines two sets of eigenvectors, each set of eigenvectors spanning a subspace of the N dimensional intensity values space. The two subspaces are: a) a K<N dimensional signal subspace spanned by the eigenvectors with high magnitude $\omega_j$ elements and b) a (N−K<N) dimensional noise subspace spanned by the eigenvectors with low magnitude and zero $\omega_j$ elements. An analysis of eigensystems is detailed in "Numerical Recipes in C, The Art of Scientific Computing", by William H. Press et al., Second Edition, Cambridge University Press, p. 456–495, (1992) which is incorporated herein by reference.

Thus, in some preferred embodiments of the present invention, the N dimensional space containing all the MR image intensity values is separated into at least two subspaces namely the signal subspace and the noise subspace.

One way of constructing an orthonormal basis of K (or N−K) vectors that span a subspace (i.e. signal subspace or noise subspace) is the well known Gram-Schmidt method. Numerically, however, because of the build-up of roundoff errors, simple Gram-Schmidt orthogonalization may be problematic (See "Numerical Recipes in C, The Art of Scientific Computing", by William H. Press et al., Second Edition, Cambridge University Press, p. 66, (1992) which is incorporated herein by reference).

In order to overcome these numerical difficulties, the singular value decomposition which is a non-linear filtering method, described hereafter, is used in some preferred embodiments of the present invention to construct the orthonormal basis of K (or N−K) vectors (see FIG. 2, step 104). Other methods of constructing such an orthonormal basis of K (or N−K) vectors that span such a subspace are described in chapter 11, "Eigensystems", of the above referenced "Numerical Recipes in C, The Art of Scientific Computing".

In case there only a single high magnitude $\omega_j$ element in matrix [W] is selected, it will preferably be contained in the first column of that matrix. Accordingly, the first column of matrix [U] will be the calculated detection function (vector) $\bar{q}_n(t_k)$.

The $\omega_j$ elements of matrix [W] which comply with the following equation, are selected for use as a detection function:

$$\omega_j/(\omega_j)_{max} \geq \epsilon \qquad (1)$$

where $\epsilon$ varies between 1 and about $10^{-2}$–$10^{-3}$ and $(\omega_j)_{max}$ is the largest singular value.

The basis vectors of the signal subspace(s) are used (recall step 108, FIG. 2) as the detection function, $\bar{q}_n(t_k)$, for the synchronous detection of a pixel's response, $q_{ij}(t_k)$, to the audio/visual/tactile activity. The detection is performed by correlating the detection function $\bar{q}_n(t_k)$, with the pixel response function $q_{ij}(t_k)$ (FIG. 3, step 70). Details of such a correlation operation, (and others), are given in "Processing Strategies for Time-Course Data sets in Functional MRI of the Human Brain", by Bandettini et al, which is incorporated herein by reference.

When the result of the singular value decomposition is just one single $\bar{q}$ vector (step 80), the result of the correlation operation is a number, $\rho_{ij}$ (step 82). Repeating the correlation for each one of the pixels (step 82), in a region of interest will result in a correlation map ($\rho$ map) comprising all the $\rho_{ij}$ elements (step 82). In the next step (step 44, FIG. 1), the $\rho_{ij}$ larger than a predetermined $\rho_{threshold}$ value are identified. The pixels corresponding to these $\rho_{ij} > \rho_{threshold}$, are considered to be active pixels (FIG. 1, numeral 50) while the remaining $\rho_{ij}$ correspond to pixels considered to be inactive (FIG. 1, numeral 49). Alternatively or additionally, other criteria may be used to determine the activity of the elements, for example, a relative threshold or a statistical test comparison.

In some cases however, the result of the singular value decomposition may be more than one detection function $\bar{q}_n(t_k)$ (n=1, ..., K; K>1). As a consequence, the correlation of a plurality of detection functions with a pixel response function will result in a K-dimensional vector, $\underline{\rho}_{ij}$, (or complex number which is an alternative representation of a two dimensional vector), rather than in a real number $\rho_{ij}$. The nth element of the $\underline{\rho}_{ij}$ vector is the result of the correlation (preferably performed as for the case of a single $\bar{q}$ vector, described above) of $\bar{q}_n(t_k)$, with the pixel response function $q_{ij}(t_k)$ (step 110 in FIG. 3). Repeating the correlation for each one of the pixels in the region of interest will result in a plurality of $\underline{\rho}_{ij}$ vectors. The ensemble of magnitudes $\|\underline{\rho}_{ij}\|$ of the $\underline{\rho}_{ij}$ vectors constitute a magnitude map ($\rho$ map) (step 112 in FIG. 3). Applying thresholding (or other selection criteria), to the magnitudes $\|\underline{\rho}_{ij}\|$ of $\underline{\rho}_{ij}$ vectors will separate the $\underline{\rho}_{ij}$ vectors into vectors related to active pixels and vectors related to inactive pixels in the same way as described above.

The ensemble of magnitudes $\|\underline{\rho}_{ij}\|$ of $\underline{\rho}_{ij}$ vectors which are related to active pixels represent a magnitude map while the phase of these vectors represent a phase map. As the magnitude of these vectors are proportional to the activation intensity, pixels which responded to the activation stimuli are extracted from the magnitude map by thresholding or by comparing to other criteria, which may be predetermine or which may be determined based on an analysis of the acquired data. Substantially constant phases are also expected to appear in the region of the phase map which corresponds to the region of highest magnitudes in the magnitude map. In a two dimensional representation, the phase is proportional to the delay between the activation task (or stimulus) and the pixel activity. This delay is an average delay between the activation task (or stimulus) and the pixel response.

In case the subject is subjected to more than one activation task and/or more than one stimulus, the N dimensional space containing the MR image intensity values is divided into more than two subspaces; the "signal" subspaces and the "noise" subspace. Each "signal" subspace relates to a response to a different audio/visual/tactile stimulus to which the subject has been subjected simultaneously. In this case, more than one detection function is calculated preferably using a detection function calculation method as described above. These detection functions are used for the synchronous detection and separation of the, probably overlapping, MRI signals related to each one of the stimuli to which the subject has been subjected.

Figure 4:
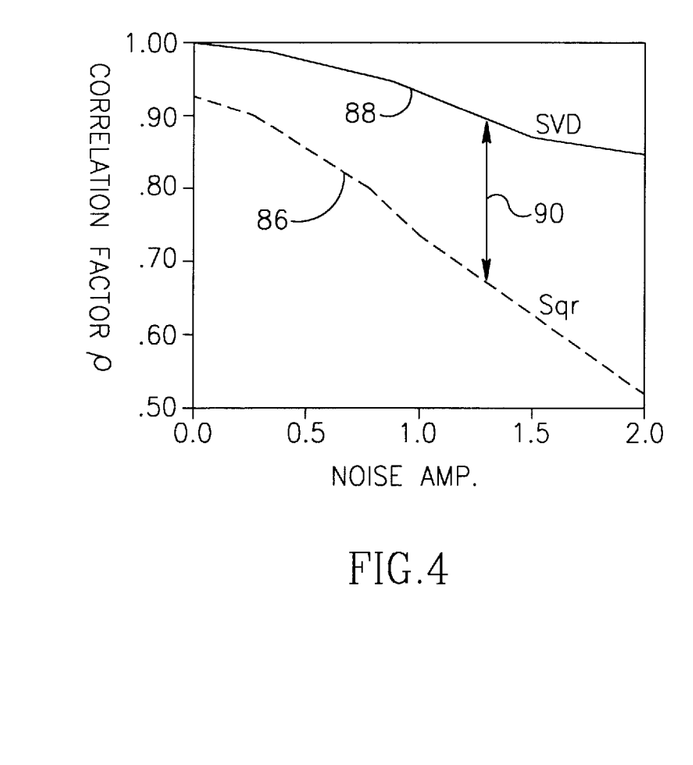
FIG. 4 shows a comparison of the behavior of representative functions obtained in prior art and in accordance with the present invention.
Figure 5:
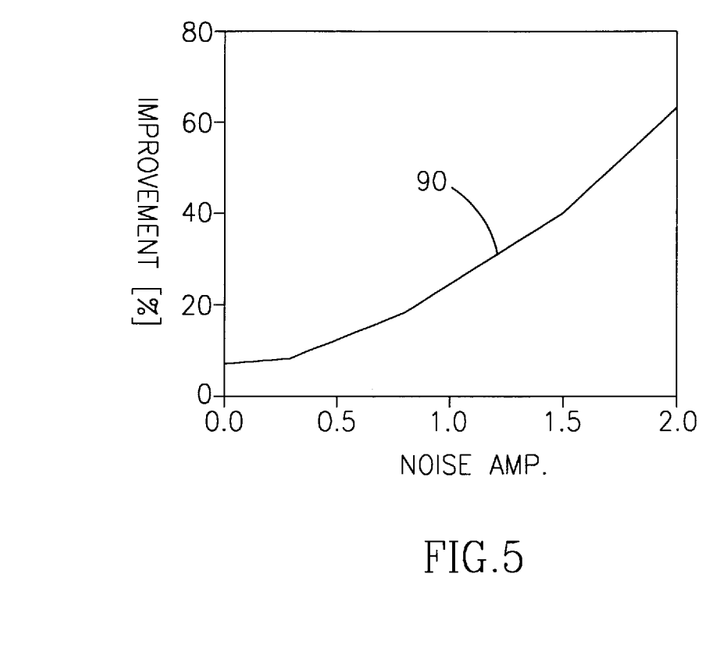
FIG. 5 shows an improvement obtained with some of preferred embodiments of the present invention compared to prior art.

Reference is now made to FIG. 4 which shows the results of an experiment made on synthetic data to determine the robustness of the various methodologies. In this method a same detection function and noise are provided at each pixel. An SVD method and a "guessed" square function are used as reference. SVD is a non-linear method of determining functional trends in data series such as successive pixel images. As such it combines a non-linear spatial filtering with a determination of most likely trends (i.e. average detection function ) for the series of images. It is seen that while the correlation factor relative to the guessed function sqr 86, drops for higher noise levels, the average detection function 88, calculated by the SVD method remains quite horizontal. Correlation factors $\rho$, show to what extent the correlation between the reference function r and the pixel response function detected by using guessed 72, or calculated 74, detection function s, remains constant for different noise amplitudes. The degree of correlation between the pixel response function synchronously detected with the detection function calculated by SVD, is influenced minimally by the noise amplitude; e.g. correlation factor $\rho$, drops only from 1 to about 0.85 for a noise amplitude of 2. Conversely, the degree of correlation between the pixel response function synchronously detected with the guessed function drops to $\rho \sim 0.50$ for the same noise amplitude. The improvement 90, brought by the SVD calculation, according to the present invention and which reaches ~60% for a noise amplitude of 2.0, compared to the conventional process, is graphically represented in FIG. 5.

The SVD method as well as a computer program named "svdcmp" utilized in the SVD calculations of the M×N matrix [A] are described in the above referenced "Numerical Recipes in C, The Art of Scientific Computing" p. 59–70, which is incorporated herein by reference.

While the invention has been described with reference to certain preferred embodiments, various modifications will be readily apparent to and may be readily accomplished be persons skilled in the art without departing from the spirit and the scope of the above teachings. Therefore, it is understood that the invention may be practiced other than as specifically described herein without departing from the scope of the following claims:

What is claimed is:

1. A method for functional MRI (fMRI) signal analysis of an area of the brain comprising:
    a) invoking neuronal activity in an area of the brain of a subject;
    b) acquiring sequential magnetic resonance images, at least during a portion of time in which said are of the brain of a subject is activated, of said area and of at least a portion of the brain in a vicinity of the area;
    c) constructing, responsive to at least one pixel-related parameter value of said images, a pixel parameter space; and
    d) applying non-linear filtering to said pixel parameter space, wherein said nonlinear filtering separates said pixel parameter space into at least two subspaces, comprising a signal subspace and a noise subspace, the method further comprising deriving a plurality of detection functions from image portions of a region of the brain in the vicinity of the area in said sequential images; and
    synchronously detecting temporal variations in said area, over a sequence of images, using synchronous detection.

2. A method according to claim 1 wherein said at least one pixel-related parameter comprises a pixel magnitude value.

3. A method according to claim 2 and comprising arranging said magnitude values in a matrix.

4. A method according to claim 3 and comprising decomposing said matrix into a product of a plurality of matrices, the columns of one matrix of the plurality of matrices comprising a plurality of basis vectors which span said at least two subspaces.

5. A method according to claim 4 wherein said at least two subspaces comprise a signal subspace and a noise subspace.

6. A method according to claim 5 wherein one basis vector spans said signal subspace.

7. A method according to claim 6 wherein said basis vector is used as a detection function.

8. A method according to claim 7, wherein said detection comprises synchronous detection.

9. A method according to claim 5 wherein two or more basis vectors span said signal subspace.

10. A method according to claim 9 wherein said basis vectors are used as synchronous detection functions.

11. A method according to claim 1 wherein said non-linear filtering uses singular value decomposition.

12. A method according to claim 1 comprising detecting temporal variations in said area over a sequence of images using a synchronous detection function.

13. A method according to claim 12 and further comprising:
   a) repeating said synchronous detection on all the pixels related to an area of interest in the brain;
   b) obtaining, for each said synchronous detection, at least one detection indicator which indicates a quality of said synchronous detection; and
   c) identifying those of said at least one detection indicator which meet at least one certain criterion.

14. A method according to claim 1 further comprising:
   a) obtaining a plurality of detection indicator values from said synchronous detection, for a plurality of pixels related to an area of interest in the brain;
   b) constructing a vector from detection indicator values associated with a single pixel, for each pixel of said plurality of pixels;
   c) calculating the magnitude of each of said vectors; and
   d) identifying those of said magnitudes which meet at least one certain criterion.

15. A method according to claim 14 further comprising deriving a vector phase from each of said vectors.

16. A method according to claim 15, comprising detecting a delay between the neuronal activity and a cause which invoked it using said phase of each vector.

17. A method according to claim 14 comprising determining at least a relative intensity of said neuronal activity from said magnitude of each vector.

18. A method according to claim 14 comprising determining an absolute intensity of said neuronal activity from said magnitude of each vector.

19. A method according to claim 1 wherein the neuronal activity in said area of the brain of a subject is periodic.

20. A method according to claim 1 wherein at least one of said MR images is acquired after a cession of said invoking of neuronal activity.

21. A method according to claim 1 comprising removing trends unrelated to said neuronal activity before said applying non linear filtering.

22. A method according to claim 1 comprising:
   a) invoking at least a second activity simultaneous with the first activity;
   b) independently extracting signals related to said at least two invoked activities.

23. A method for functional MRI (fMRI) signal analysis of an area of the brain comprising:
   a) invoking neuronal activity in an area of the brain of a subject;
   b) acquiring sequential magnetic resonance images, at least during a portion of time in which said area of the brain of a subject is activated, of said area and of at least a portion of the brain in a vicinity of the area;
   c) registering said sequential images;
   d) constructing a pixel parameter space, responsive to pixel magnitude values in said images;
   e) removing, from said space, at least one trend unrelated to said neuronal activity;
   f) arranging said trend-removed magnitude values in a matrix;
   g) separating said pixel parameter space into at least two subspace, using singular value decomposition, such that said matrix is decomposed into a product of a plurality of matrices, the columns of one matrix of the plurality of matrices comprising a plurality of basis victors which span said at least two subspaces;
   h) identifying said at least two subspaces as a signal subspace and as a noise subspace;
   i) selecting at least one of said basis vectors which spans said signal subspace;
   j) detecting variations in said area of the brain over a sequence of images using said at least one vector as a synchronous detection function, for all the pixels related to an area of interest in the brain;
   k) obtaining, for each said synchronous detection, at least one detection indicator which indicates a quality of said synchronous detection.

24. A method according to claim 23, wherein said at least one basis vector which spans said signal subspace comprises at least two independent basis vectors.

25. A method according to claim 24, wherein a plurality of detection indicators are obtained for each pixel, comprising:
   constructing a vector from said detection indicators; and
   calculating the magnitude of each said vector.

* * * * *